United States Patent
Yang et al.

(10) Patent No.: US 9,748,283 B2
(45) Date of Patent: Aug. 29, 2017

(54) SYSTEM AND METHOD OF MANUFACTURING A THIN FILM TRANSISTOR SUBSTRATE

(71) Applicant: Samsung Display Co., LTD., Yongin, Gyeonggi-Do (KR)

(72) Inventors: Su-Kyoung Yang, Yongin-si (KR); Sang-Won Shin, Yongin-si (KR); Hyun-Eok Shin, Gwacheon-si (KR); Chan-Woo Yang, Siheung-si (KR); Dong-Min Lee, Anyang-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/664,232

(22) Filed: Mar. 20, 2015

(65) Prior Publication Data

US 2016/0099264 A1    Apr. 7, 2016

(30) Foreign Application Priority Data

Oct. 6, 2014  (KR) .................. 10-2014-0134582

(51) Int. Cl.
*H01L 21/28*  (2006.01)
*H01L 27/12*  (2006.01)
(Continued)

(52) U.S. Cl.
CPC .......... *H01L 27/1259* (2013.01); *C23C 14/02* (2013.01); *C23C 14/541* (2013.01); *C23C 14/5806* (2013.01); *H01L 21/28008* (2013.01); *H01L 29/42356* (2013.01); *H01L 29/42372* (2013.01); *H01L 29/42384* (2013.01); *H01L 29/45* (2013.01); *H01L 29/495* (2013.01);
(Continued)

(58) Field of Classification Search
CPC ... C23C 14/541; C23C 14/02; H01L 27/1259; H01L 21/28008; H01L 21/28568; H01L 29/42356; H01L 29/42372; H01L 29/4908; H01L 29/42384; H01L 29/66742; H01L 29/495; H01L 29/45; H01L 21/2855
See application file for complete search history.

(56) References Cited

U.S. PATENT DOCUMENTS

2006/0245852 A1* 11/2006 Iwabuchi .......... H01L 21/67201
                                                            414/217
2008/0075853 A1*  3/2008 Barth ................. C03C 17/347
                                                            427/248.1
2013/0280838 A1* 10/2013 Shin ................. H01L 29/66742
                                                            438/34

FOREIGN PATENT DOCUMENTS

KR    10-2003-0093790 A    12/2003
KR    10-2007-0077784 A    7/2007
(Continued)

*Primary Examiner* — Julio J Maldonado
*Assistant Examiner* — Stanetta Isaac
(74) *Attorney, Agent, or Firm* — Innovation Counsel LLP

(57) ABSTRACT

In a method of manufacturing a thin film transistor substrate, a first metal layer is formed on a first surface of a base substrate. The base substrate is cooled by contacting the first metal layer with a first cooling plate and by contacting a second surface of the base substrate with a second cooling plate. The first and second surfaces of the base substrate face opposite directions. A gate electrode is formed by patterning the first metal layer. A source electrode and a drain electrode are formed. The source electrode is spaced apart from the drain electrode. The source and drain electrodes partially overlap the gate electrode. A pixel electrode electrically connected to the drain electrode is formed.

10 Claims, 6 Drawing Sheets

(51) Int. Cl.
*H01L 29/66* (2006.01)
*H01L 29/49* (2006.01)
*H01L 29/423* (2006.01)
*H01L 29/45* (2006.01)
*C23C 14/02* (2006.01)
*C23C 14/58* (2006.01)
*C23C 14/54* (2006.01)
*H01J 37/34* (2006.01)

(52) U.S. Cl.
CPC .... *H01L 29/4908* (2013.01); *H01L 29/66742* (2013.01); *H01J 37/34* (2013.01)

(56) References Cited

FOREIGN PATENT DOCUMENTS

KR   10-2013-0117524 A   10/2013
KR   10-2013-0123054 A   11/2013

* cited by examiner

SYSTEM AND METHOD OF MANUFACTURING A THIN FILM TRANSISTOR SUBSTRATE

CROSS-REFERENCE TO RELATED APPLICATION

This application claims priority under 35 USC §119 to Korean Patent Application No. 10-2014-0134582, filed on Oct. 6, 2014 in the Korean Intellectual Property Office (KIPO), the contents of which are herein incorporated by reference in their entirety.

BACKGROUND

1. Technical Field

Example embodiments relate generally to display apparatuses, and more particularly, to methods of manufacturing thin film transistor substrates and apparatuses for manufacturing the thin film transistor substrates.

2. Description of the Related Art

A display apparatus may be a flat panel display ("FPD") and include a liquid crystal display ("LCD"), a plasma display panel ("PDP") and an organic light emitting display ("OLED"). An LCD apparatus applies voltages to the liquid crystal molecules to adjust the arrangement of the molecules, thereby changing the optical characteristics of the liquid crystal molecules, such as birefringence, optical activity, dichroism and light scattering, to display an image.

Generally, a display substrate used in a display apparatus includes a switching element such as a thin-film transistor ("TFT") for driving a pixel area, signal lines connected to the TFT, and a pixel electrode. The signal lines include a gate line transmitting a gate driving signal and a data line crossing the gate line and transmitting a data driving signal.

As a display apparatus increases in size, the width of its signal lines may decrease, and thereby cause the electrical resistance of the signal lines to increase. In such case, the resistance-capacitance ("RC") signal delay in the signal lines would increase. To reduce the RC signal delay, the signal lines may be formed to include a metal having a relatively low resistance and an increased thickness.

However, the time for depositing the signal lines (e.g., a deposition process time) may increase if the signal lines are to be formed with an increased thickness. Moreover, since the deposition process is performed at a relatively high temperature, increasing the deposition process time may cause the temperature of the display substrate to rise to a point at which the display substrate begins to deform. The quality of the display apparatus may be degraded due to deformation of the display substrate.

SUMMARY

The present system and method substantially obviate one or more problems that exist as a result of the limitations and disadvantages of the related art.

Some example embodiments provide a method of manufacturing a thin film transistor substrate capable of preventing the bent of the substrate.

Some example embodiments provide an apparatus for manufacturing the thin film transistor substrate.

According to example embodiments, in a method of manufacturing a thin film transistor substrate, a first metal layer is formed on a first surface of a base substrate. The base substrate is cooled by contacting the first metal layer with a first cooling plate and by contacting a second surface of the base substrate with a second cooling plate. The first and second surfaces of the base substrate face opposite directions. A gate electrode is formed by patterning the first metal layer. A source electrode and a drain electrode are formed. The source electrode is spaced apart from the drain electrode. The source and drain electrodes partially overlap the gate electrode. A pixel electrode electrically connected to the drain electrode is formed.

In an example embodiment, the first metal layer may include at least one conductive material selected from the group consisting of aurum (Au), copper (Cu), nickel (Ni), aluminum (Al), molybdenum (Mo), chrome (Cr), tantalum (Ta), titanium (Ti) and an alloy thereof.

In an example embodiment, the first metal layer may have a thickness of about 1 µm to about 3 µm.

In an example embodiment, the base substrate may be cooled to a temperature of about −60° C. to about 0° C.

In forming the gate electrode, the cooled base substrate may be preheated before the first metal layer is patterned.

The base substrate may be preheated to the ambient temperature.

In forming the source electrode and the drain electrode, a second metal layer may be formed on the base substrate on which the gate electrode is formed. The base substrate may be cooled by contacting the second metal layer with the first cooling plate and by contacting the second surface of the base substrate with the second cooling plate. The second metal layer may be patterned.

The second metal layer may include at least one conductive material selected from the group consisting of aurum (Au), copper (Cu), nickel (Ni), aluminum (Al), molybdenum (Mo), chrome (Cr), tantalum (Ta), titanium (Ti) and an alloy thereof.

In forming the pixel electrode, a third metal layer may be formed on the base substrate on which the source and drain electrodes are formed. The base substrate may be cooled by contacting the third metal layer with the first cooling plate and by contacting the second surface of the base substrate with the second cooling plate. The third metal layer may be patterned.

The third metal layer may include at least one conductive material selected from the group consisting of indium tin oxide (ITO), indium zinc oxide (IZO) and aluminum zinc oxide (AZO).

According to example embodiments, an apparatus for manufacturing a thin film transistor substrate includes a loading chamber, a loadlock chamber, a buffer chamber, a process chamber and a transfer chamber. The loading chamber supplies and releases a base substrate. The base substrate is transferred upright by an inline process. The loadlock chamber creates a vacuum for the base substrate. The buffer chamber stabilizes the vacuum provided from the loadlock chamber. The process chamber deposits conductive material on the base substrate provided from the buffer chamber. The transfer chamber cools the base substrate on which the conductive material is deposited and returns the base substrate to the process chamber. The transfer chamber includes a first cooling plate and a second cooling plate positioned opposite to the first cooling plate. The base substrate is cooled by pressing the first and second cooling plates against the first and second surfaces of the base substrate, respectively.

In an example embodiment, the buffer chamber may include a heating plate that preheats the base substrate before the conductive material is deposited on the base substrate.

In an example embodiment, the process chamber may include a first process chamber and a second process chamber that are sequentially located.

In an example embodiment, the conductive material may be deposited on the base substrate by a sputtering process.

In an example embodiment, the conductive material may include at least one selected from the group consisting of aurum (Au), copper (Cu), nickel (Ni), aluminum (Al), molybdenum (Mo), chrome (Cr), tantalum (Ta), titanium (Ti) and an alloy thereof.

In an example embodiment, the conductive material may include at least one selected from the group consisting of indium tin oxide (ITO), indium zinc oxide (IZO) and aluminum zinc oxide (AZO).

In an example embodiment, the base substrate may be cooled in the vacuum by the transfer chamber.

In an example embodiment, a chiller may be located at a surface of each of the first and second cooling plates, and the first and second cooling plates may be cooled by the chiller.

In an example embodiment, liquid nitrogen may be injected into the chiller.

In an example embodiment, the base substrate may be cooled to a temperature of about −60° C. to about 0° C.

Accordingly, when the thin film transistor substrate is manufactured based on the method of manufacturing the thin film transistor substrate and/or the apparatus for manufacturing the thin film transistor substrate according to example embodiments, deformation of the substrate due to excessive temperatures may be prevented or otherwise reduced.

BRIEF DESCRIPTION OF THE DRAWINGS

Illustrative, non-limiting example embodiments of the present system and method are described below in conjunction with the accompanying drawings of figures.

DETAILED DESCRIPTION OF THE EMBODIMENTS

Figure 1:
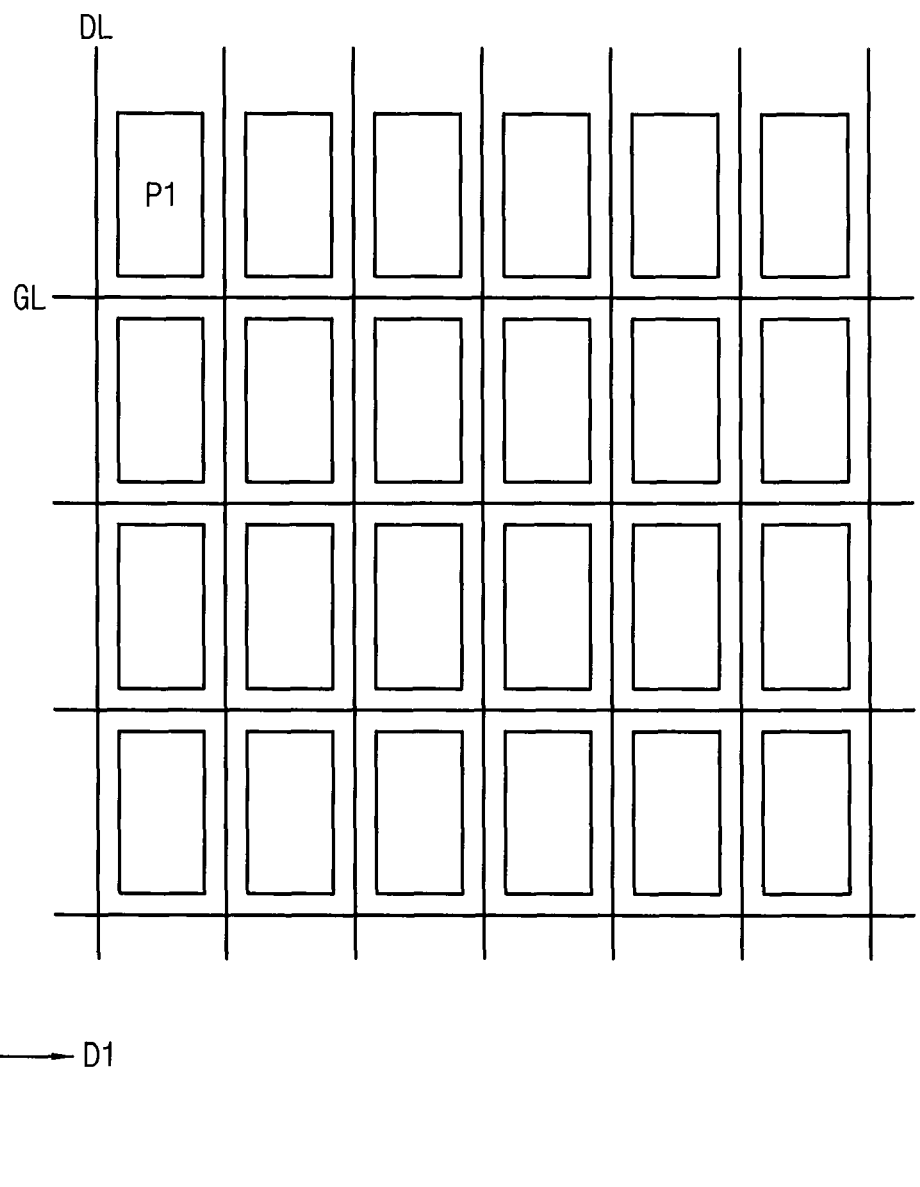
FIG. 1 is a plan view illustrating a thin film transistor substrate according to example embodiments.

Various example embodiments are described with reference to the accompanying drawings in which the embodiments are shown. The present system and method may, however, be embodied in many different forms and are not limited to the embodiments set forth herein. Rather, these embodiments are provided to facilitate the understanding of the present system and method by those of ordinary skill in the art. Like reference numerals refer to like elements throughout this application.

Although the terms "first," "second," etc. may be used herein to describe various elements, these elements are not limited by these terms. These terms are used to distinguish one element from another. For example, a first element may be referred to as a second element, and, vice versa, a second element may be referred to as a first element. As used herein, the term "and/or" includes any and all combinations of one or more of the associated listed items.

When an element is referred to as being "connected" or "coupled" to another element, it may be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminologies used herein for describing the particular embodiments are not limiting of the present system and method. As used herein, the singular forms of the articles "a," "an" and "the" include the plural forms as well, unless the context clearly indicates otherwise. The terms "comprises," "comprising," "includes" and/or "including," when used herein, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the meaning commonly understood by one of ordinary skill in the art to which the present system and method belong. That is, terms, including those defined in commonly used dictionaries, are to be interpreted as having a meaning that is consistent with their meaning in the context of the relevant art.

Figure 2:
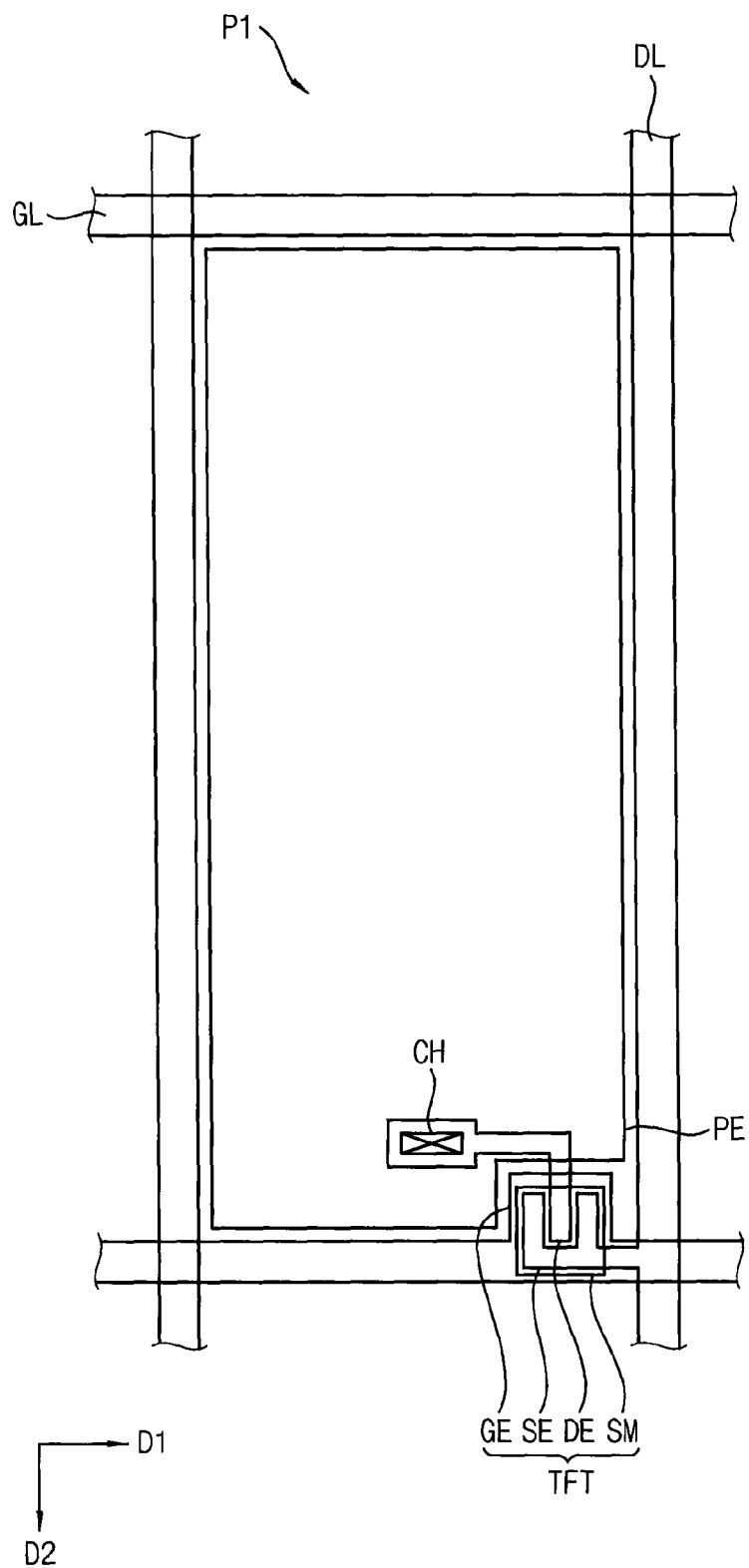
FIG. 2 is a plan view illustrating an example of a pixel included in the thin film transistor substrate of FIG. 1.
Figure 3:
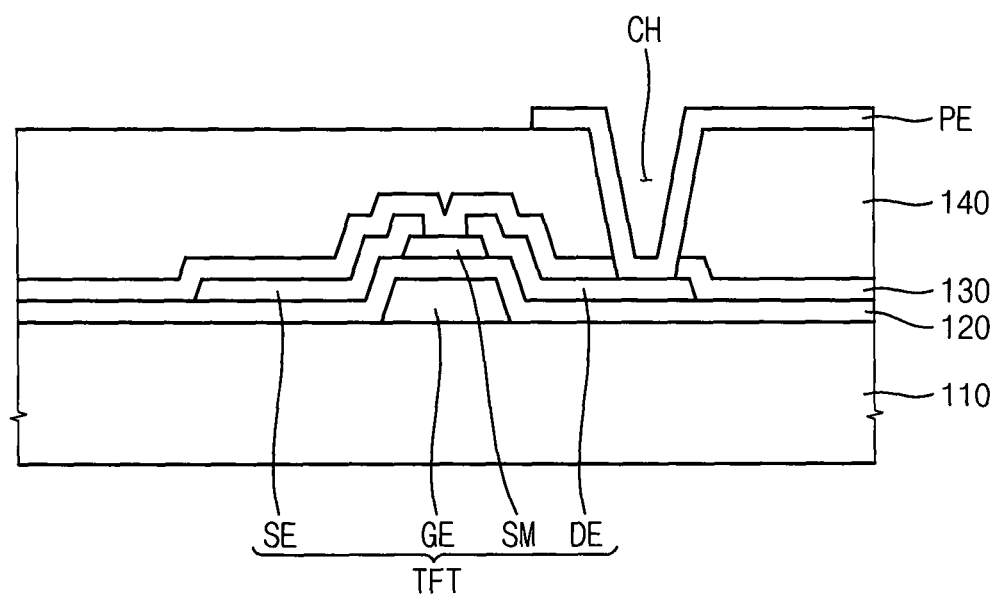
FIG. 3 is a cross-sectional view illustrating the thin film transistor substrate of FIG. 1.

FIG. 1 is a plan view illustrating a thin film transistor substrate according to example embodiments. FIG. 2 is a plan view illustrating an example of a pixel included in the thin film transistor substrate of FIG. 1. FIG. 3 is a cross-sectional view illustrating the thin film transistor substrate of FIG. 1.

Referring to FIG. 1, a thin film transistor substrate includes a plurality of gate lines GL, a plurality of data lines DL and a plurality of pixels (e.g., P1). The plurality of gate lines GL extends in a first direction D1, and the plurality of data lines DL extends in a second direction D2 crossing (e.g., substantially perpendicular to) the first direction D1. In another embodiment that differs from that of FIG. 1, the plurality of gate lines DL may extend in the second direction D2, and the plurality of data lines DL may extend in the first direction D1.

The plurality of pixels may be arranged in a matrix form. The plurality of pixels may be disposed in a plurality of pixel areas that are defined by the plurality of gate lines GL and the plurality of data lines DL. Each pixel may be connected to a respective one of the gate lines GL (e.g., an adjacent gate line) and a respective one of the data lines DL (e.g., an adjacent data line). For example, as FIG. 2 shows, a first pixel P1 may be connected to a lower-adjacent gate line GL and a left-adjacent data line DL. Each pixel may have, but are not limited to, a rectangular shape, a V shape, a Z shape, etc.

Referring to FIGS. 1, 2 and 3, the thin film transistor substrate includes a base substrate 110, a gate insulation layer 120, a data insulation layer 130, a thin film transistor TFT, a color filter 140 and a pixel electrode PE. The base substrate 110 may be a transparent substrate that includes insulation material. For example, the base substrate 110 may be a glass substrate or a transparent plastic substrate. The base substrate 110 may include the plurality of pixel areas for displaying an image. The plurality of pixel areas may be arranged in a matrix form.

Each pixel may include a switching element, such as the thin film transistor TFT. The switching element may be connected to the respective one of the gate lines (e.g., the adjacent gate line) and the respective one of the data lines (e.g., the adjacent data line).

A gate pattern may be disposed on the base substrate 110. The gate pattern may include a gate electrode GE and a gate line GL. The gate line GL may be electrically connected to the gate electrode GE.

The gate insulation layer 120 may be disposed on the base substrate 110 on which the gate pattern is disposed and insulate the gate pattern. The gate insulation layer 120 may include an inorganic insulation material. For example, the gate insulation layer 120 may include silicon oxide ($SiO_X$) and/or silicon nitride ($SiN_X$).

A semiconductor pattern SM may be disposed on the gate insulation layer 120. The semiconductor pattern SM may overlap the gate electrode GE.

A data pattern may be disposed on the gate insulation layer 120 on which the semiconductor pattern SM is disposed. The data pattern may include a source electrode SE, a drain electrode DE and a data line DL.

The source electrode SE may partially overlap the semiconductor pattern SM. The source electrode SE may be electrically connected to the data line DL. The drain electrode DE may overlap a first portion of the semiconductor pattern SM, and the source electrode SE may overlap a second portion of the semiconductor pattern SM. The first and second portions of the semiconductor pattern SM may be spaced apart by a third portion of the semiconductor pattern SM. That is, the drain electrode may be spaced apart from the source electrode SE with respect to the semiconductor pattern SM. The semiconductor pattern SM may have a conductive channel between the source electrode SE and the drain electrode DE.

The data insulation layer 130 may be disposed on the gate insulation layer 120 on which the semiconductor pattern SM and the data pattern are disposed. The semiconductor pattern SM and the data pattern may be insulated by the data insulation layer 130. The data insulation layer 130 may cover the thin film transistor TFT, which as FIG. 3 shows, may include the gate electrode GE, the source electrode SE, the drain electrode DE and the semiconductor pattern SM. The data insulation layer 130 may include inorganic insulation material. For example, the data insulation layer 130 may include silicon oxide ($SiO_X$) and/or silicon nitride ($SiN_X$).

The color filter 140 may be disposed on the data insulation layer 130. The color filter 140 may be one of a red color filter, green color filter and a blue color filter. Each color filter may correspond to a respective one of the pixel areas. Color filters of adjacent pixel areas may have different colors from each other.

According to one embodiment, the color filters may overlap the border between adjacent pixel areas. In another embodiment, the color filters may be spaced apart from the border between pixel areas adjacent to each other in the first direction D1. The color filters may be formed in an island-shape on the gate lines and the data lines.

The pixel electrode PE may be disposed on the color filter 140 in each pixel area. The pixel electrode PE may be electrically connected to the drain electrode DE of the thin film transistor TFT through a contact hole CH. A grayscale voltage may be applied to the pixel electrode PE through the thin film transistor TFT.

The pixel electrode PE may include a transparent conductive material. For example, the pixel electrode PE may include indium tin oxide (ITO), indium zinc oxide (IZO) and/or aluminum-doped zinc oxide (AZO). The pixel electrode PE may have a slit pattern.

Figure 4A:
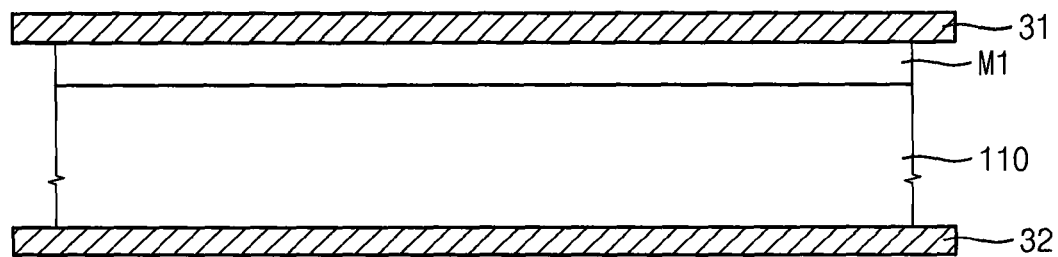
FIGS. 4A, 4B, 4C and 4D are cross-sectional views showing a method of manufacturing a thin film transistor substrate according to example embodiments.

FIGS. 4A, 4B, 4C and 4D are cross-sectional views showing a method of manufacturing a thin film transistor substrate according to example embodiments. Referring to FIG. 4A, a first metal layer M1 is formed on a first surface of the base substrate 110, such as by depositing conductive material on the base substrate 110. For example, the conductive material may include aurum (Au), copper (Cu), nickel (Ni), aluminum (Al), molybdenum (Mo), chrome (Cr), tantalum (Ta), titanium (Ti) and/or an alloy thereof. In other words, the first metal layer M1 may include a conductive material selected from the group consisting of aurum (Au), copper (Cu), nickel (Ni), aluminum (Al), molybdenum (Mo), chrome (Cr), tantalum (Ta), titanium (Ti) and an alloy thereof.

In some example embodiments, the first metal layer M1 may be formed as a single layer using a single deposition process. In other example embodiments, the first metal layer M1 may be formed as multiple layers using a plurality of deposition processes.

In some example embodiments, the conductive material may be deposited on the base substrate 110 by a sputtering process. In other words, the first metal layer M1 may be formed by the sputtering process.

In some example embodiments, the base substrate 110 may be preheated before the first metal layer M1 is formed on (e.g., the conductive material is deposited on) the base substrate 110. The efficiency of forming the first metal layer M1 (e.g., the efficiency of depositing the conductive material) may be improved by the preheating process. For example, the base substrate 110 may be preheated to a temperature under 250° C. After the first metal layer M1 is deposited on the base substrate 110, the base substrate 110 may have a temperature of about 250° C. to about 350° C.

The first metal layer M1 may have a thickness of about 1 µm to about 3 µm. As the thickness of the first metal layer M1 increases, the deposition time for depositing the first metal layer M1 may also increase. Increasing the deposition time, however, may cause the temperature of the base substrate 110 to increase to a point at which the base substrate 110 begins to deform. For example, when the thickness of the first metal layer M1 is about 1 µm, the planar height difference between a central area and an edge area of the base substrate 110 may range from 0.12 µm to about 1.05 µm. When the thickness of the first metal layer M1 is about 2 µm, the planar height difference between the central area and the edge area of the base substrate 110 may range from 1.08 µm to about 2.10 µm. When the thickness of the first metal layer M1 is about 3 µm, the planar height difference between the central area and the edge area of the base substrate 110 may range from 2.00 µm to about 2.65 µm. In other words, the thicker the first metal layer M1 is formed to be, the less flat the base substrate 110 becomes due to deformation.

As illustrated in FIG. 4A, the base substrate 110 on which the first metal layer M1 is formed may be cooled by contacting a first cooling plate 31 and a second cooling plate 32. More specifically, the base substrate 110 may be cooled by contacting the top (orientation as shown in FIGS. 4A to 4D) surface of the first metal layer M1 with the first cooling plate 31. The base substrate 110 also may be cooled by contacting its bottom surface with the second cooling plate 32. The base substrate 110 may be cooled to a temperature of about −60° C. to about 0° C.

Figure 4B:
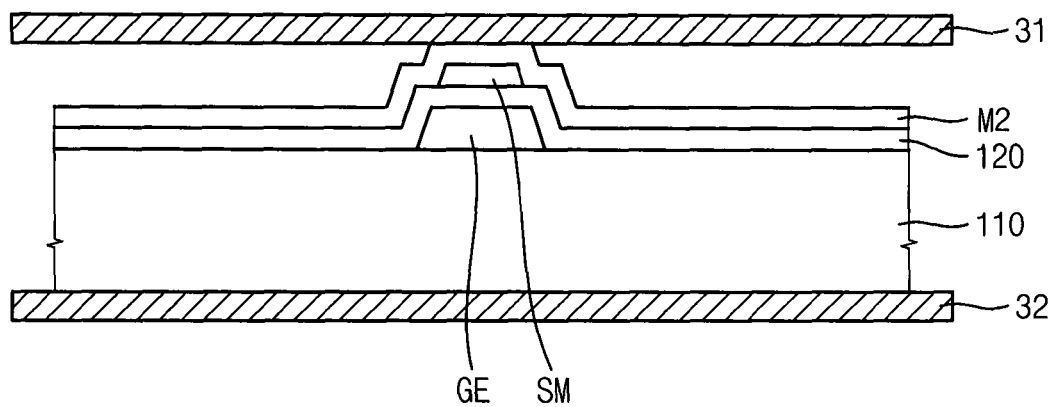

Although not illustrated in FIGS. 4A and 4B, a photoresist material may be formed or coated on the first metal layer M1. The photoresist layer may be exposed to light using a mask and then developed to form photoresist patterns at positions where the gate electrode GE and the gate line GL are to be formed. Using the photoresist patterns as a mask, exposed portions of the first metal layer M1 may be removed to form the gate electrode GE and the gate line GL. The photoresist patterns may be subsequently removed, for example, using a dry-etch process. In other words, the gate electrode GE and the gate line GL may be formed by patterning the first metal layer M1 using the photoresist patterns as a mask.

In some example embodiments, the base substrate 110 may be preheated before the photoresist material is coated on the first metal layer M1. For example, the base substrate 110 may be preheated to the ambient temperature.

The gate insulation layer 120 may be formed on the base substrate 110 by depositing an inorganic insulation material on the base substrate 110 on which the gate electrode GE and the gate line GL are formed. The gate electrode GE and the gate line GL may be insulated by the gate insulation layer 120. For example, the inorganic insulation material may include a silicon oxide ($SiO_x$) and/or silicon nitride ($SiN_x$).

Referring to FIG. 4B, the semiconductor pattern SM may be formed on the gate insulation layer 120. The semiconductor pattern SM may overlap the gate electrode GE.

Also referring to FIG. 4B, a second metal layer M2 may be formed on the gate insulation layer 120 by depositing conductive material on the gate insulation layer 120 on which the semiconductor pattern SM is formed. For example, the conductive material may include aurum (Au), copper (Cu), nickel (Ni), aluminum (Al), molybdenum (Mo), chrome (Cr), tantalum (Ta), titanium (Ti) and/or an alloy thereof. In other words, the second metal layer M2 may include a conductive material selected from the group consisting of aurum (Au), copper (Cu), nickel (Ni), aluminum (Al), molybdenum (Mo), chrome (Cr), tantalum (Ta), titanium (Ti) and an alloy thereof.

In some example embodiments, the second metal layer M2 may be formed as a single layer using a single deposition process. In other example embodiments, the second metal layer M2 may be formed as multiple layers using a plurality of deposition processes. The second metal layer M2 may have a thickness of about 50 Å to about 300 Å.

In some example embodiments, the conductive material may be deposited on the gate insulation layer 120 by a sputtering process. In other words, the second metal layer M2 may be formed by the sputtering process.

In some example embodiments, the base substrate 110 may be preheated before the second metal layer M2 is formed on (e.g., the conductive material is deposited on) the gate insulation layer 120 so as to improve the efficiency of forming the second metal layer M2 (e.g., the efficiency of depositing the conductive material). For example, the base substrate 110 may be preheated to a temperature under 250° C. After the second metal layer M2 is deposited on the base substrate 110, the base substrate 110 may have a temperature of about 250° C. to about 350° C.

As illustrated in FIG. 4B, the base substrate 110 on which the second metal layer M2 is formed may be cooled by contacting the first cooling plate 31 and the second cooling plate 32. More particularly, the base substrate 110 may be cooled by contacting the second metal layer M2 with the first cooling plate 31. The base substrate 110 also may be cooled by contacting its bottom surface with the second cooling plate 32. The base substrate 110 may be cooled to a temperature of about −60° C. to about 0° C.

Figure 4C:
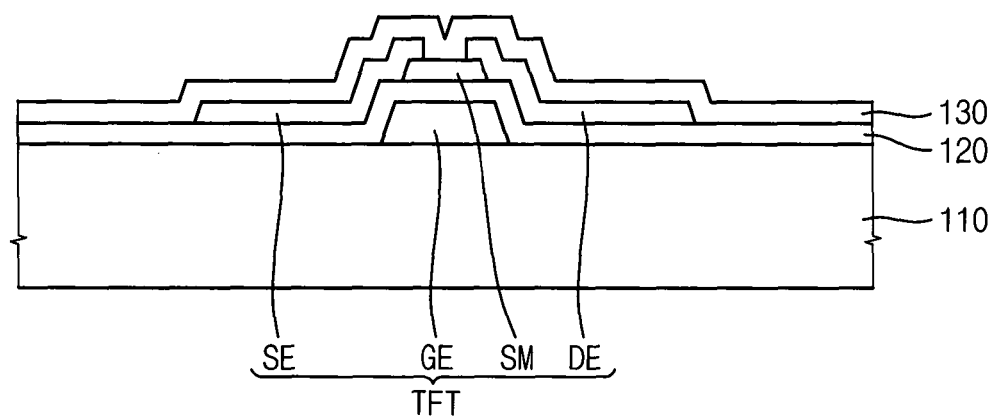

Although not illustrated in FIGS. 4B and 4C, a photoresist material may be formed or coated on the second metal layer M2. The photoresist layer may be exposed to light using a mask and then developed to form photoresist patterns at positions where the source electrode SE, the drain electrode DE and the data line DL are to be formed. The mask may be a halftone mask. Using the photoresist patterns as a mask, an exposed portion of the second metal layer M2 may be removed to form the source electrode SE, the drain electrode DE and the data line DL. The photoresist patterns may be subsequently removed, for example, using a dry-etch process. In other words, the source electrode SE, the drain electrode DE and the data line DL may be formed by patterning the second metal layer M2 using the photoresist patterns as a mask.

In some example embodiments, the base substrate 110 may be preheated before the photoresist material is coated on the second metal layer M2. For example, the base substrate 110 may be preheated to the temperature.

Referring to FIG. 4C, the data insulation layer 130 may be formed on the base substrate 110 by depositing an inorganic insulation material on the base substrate 110 on which the source electrode SE, the drain electrode DE and the data line DL are formed. The source electrode SE, the drain electrode DE and the data line DL may be insulated by the data insulation layer 130. For example, the inorganic insulation material may include silicon oxide ($SiO_x$) and/or silicon nitride ($SiN_x$).

Figure 4D:
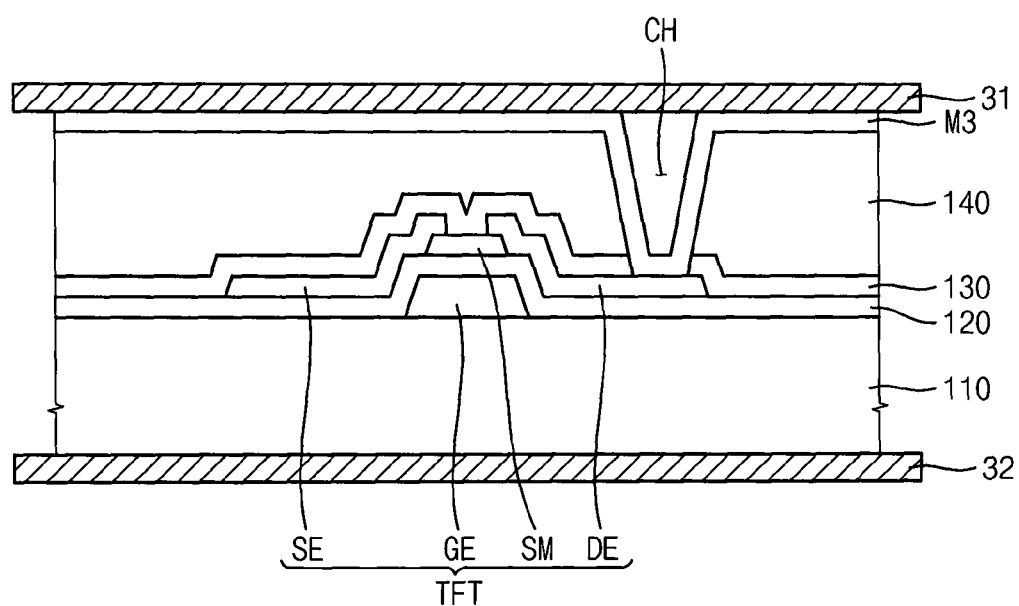

Referring to FIG. 4D, the color filter 140 may be formed on the data insulation layer 130 by coating a photoresist material for the color filter on the data insulation layer 130. In some example embodiments, the color filter 140 may include the contact hole CH for exposing a portion of the drain electrode DE. A third metal layer M3 may be formed on the color filter 140 by depositing conductive material on the color filter 140 in which the contact hole CH is formed.

In some example embodiments, the third metal layer M3 may include a transparent conductive material. For example, the third metal layer M3 may include indium tin oxide (ITO), indium zinc oxide (IZO) and/or aluminum zinc oxide (AZO).

In some example embodiments, the third metal layer M3 may be formed as a single layer using a single deposition process. In other example embodiments, the third metal layer M3 may be formed as multiple layers using a plurality of deposition processes.

In some example embodiments, the transparent conductive material may be deposited on the color filter 140 by a sputtering process. In other words, the third metal layer M3 may be formed by the sputtering process.

In some example embodiments, the base substrate 110 may be preheated before the third metal layer M3 is formed on (e.g., the transparent conductive material is deposited on) the color filter 140 so as to improve the efficiency of forming the third metal layer M3 (e.g., the efficiency of depositing the transparent conductive material). For example, the base substrate 110 may be preheated to a temperature under 250° C. After the third metal layer M3 is deposited on the base substrate 110, the base substrate 110 may have a temperature of about 250° C. to about 350° C.

As illustrated in FIG. 4D, the base substrate 110 on which the third metal layer M3 is formed may be cooled by contacting the first cooling plate 31 and the second cooling plate 32. More particularly, the base substrate 110 may be cooled by contacting the third metal layer M3 with the first cooling plate 31. The base substrate 110 also may be cooled by contacting its bottom surface with the second cooling plate 32. The base substrate 110 may be cooled to a temperature of about −60° C. to about 0° C.

Although not illustrated in FIG. 4D, a photoresist material may be formed or coated on the third metal layer M3. The photoresist layer may be exposed to light using a mask and then developed to form a photoresist pattern at a position where the pixel electrode PE is to be formed. Using the photoresist pattern as a mask, an exposed portion of the third metal layer M3 may be removed to form the pixel electrode PE. The photoresist pattern may be subsequently removed, for example, using a dry-etch process. In other words, the pixel electrode PE may be formed by patterning the third metal layer M3 using the photoresist pattern as a mask.

In some example embodiments, the base substrate 110 may be preheated before the photoresist material is coated on the third metal layer M3. For example, the base substrate 110 may be preheated to the ambient temperature.

The drain electrode DE of the thin film transistor TFT may be electrically connected to the pixel electrode PE through the contact hole CH. A grayscale voltage may be applied to the pixel electrode PE through the thin film transistor TFT. In some example embodiments, the pixel electrode PE may have a slit pattern.

Figure 5:
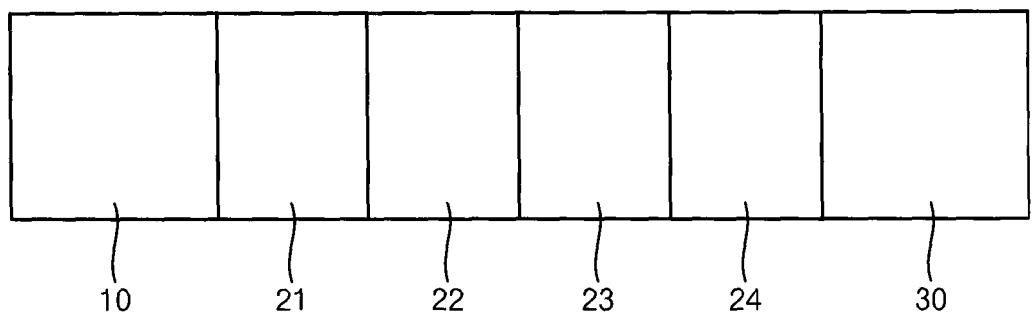
FIG. 5 is a plan view illustrating an apparatus for manufacturing a thin film transistor substrate according to example embodiments.
Figure 6A:
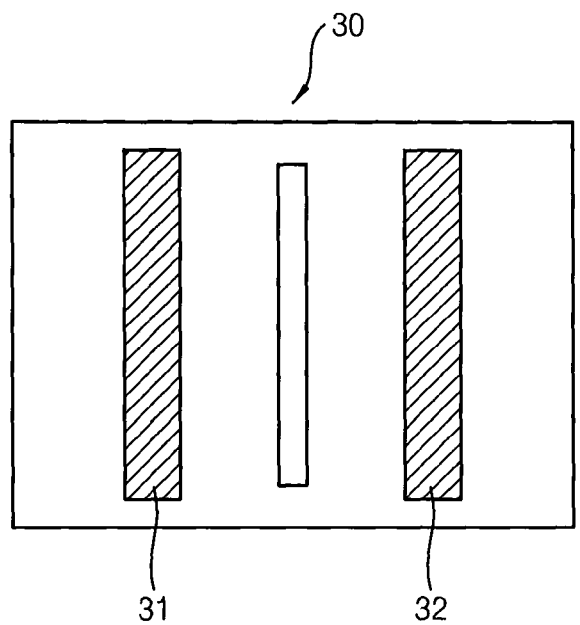
FIGS. 6A and 6B are cross-sectional views showing an operation of a transfer chamber included in the apparatus of FIG. 5 according to example embodiments.
Figure 6B:
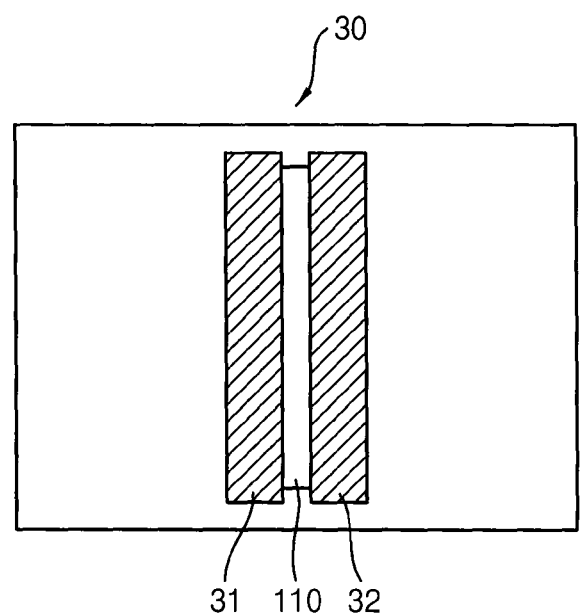

FIG. 5 is a plan view illustrating an apparatus for manufacturing a thin film transistor substrate according to example embodiments. FIGS. 6A and 6B are cross-sectional views for describing an operation of a transfer chamber included in the apparatus of FIG. 5 according to example embodiments.

Referring to FIGS. 5, 6A and 6B, the apparatus for manufacturing a thin film transistor substrate includes a loading chamber 10, a loadlock chamber 21, a buffer chamber 22, a process chamber and a transfer chamber 30. The process chamber may include a first process chamber 23 and a second process chamber 24.

The loading chamber 10 may supply the base substrate 110 to the apparatus and release the base substrate 110 from the apparatus. Within the apparatus, the base substrate 110 may be transferred by an inline process and in an upright orientation.

With the inline process, the loading chamber 10 and the chambers for depositing patterns and/or material on the base substrate 110 may be located in a line or sequence. The base substrate 110 may be loaded into the loading chamber 10, the deposition process may be performed on the base substrate 110, and then the base substrate 110 may be unloaded (e.g., unloaded from the loading chamber 10). The deposition process may be sequentially performed by the inline process.

The loadlock chamber 21 and the buffer chamber 22 may be located between the loading chamber 10 and the process chamber and transfer the base substrate 110 from the loading chamber 10 to the process chamber. The loadlock chamber 21 may create a vacuum for the base substrate 110. For example, when the base substrate 110 is transferred from the loading chamber 10 to the loadlock chamber 21, the inside of the loadlock chamber 21 may be decompressed by a vacuum pump. The buffer chamber 22 may stabilize the vacuum provided from the loadlock chamber 21. For example, the pressure difference between the loadlock chamber 21 and the process chamber may be reduced by the buffer chamber 22 before the base substrate 110 is transferred to the process chamber.

In some example embodiments, the buffer chamber 22 may include a heating plate that preheats the base substrate 110 before conductive material is deposited on the base substrate 110 so as to improve the efficiency of depositing the conductive material. For example, the base substrate 110 may be preheated to a temperature under 250° C.

The process chamber may deposit the conductive material on the base substrate 110 provided from the buffer chamber 22. In some example embodiments, the conductive material may be deposited on the base substrate 110 by a sputtering process.

In some example embodiments, the conductive material may be deposited on the base substrate 110 for forming the gate pattern (e.g., the gate electrode GE and/or the gate line GL) and/or the data pattern (e.g., the source electrode SE, the drain electrode DE and/or the data line DL). In this case, the conductive material may include aurum (Au), copper (Cu), nickel (Ni), aluminum (Al), molybdenum (Mo), chrome (Cr), tantalum (Ta), titanium (Ti) and/or an alloy thereof. In other example embodiments, the conductive material (e.g., the transparent conductive material) may be deposited on the base substrate 110 for forming the pixel electrode PE. In this case, the conductive material may include indium tin oxide (ITO), indium zinc oxide (IZO) and/or aluminum zinc oxide (AZO).

The process chamber may include the first process chamber 23 and the second process chamber 24 that are sequentially located. The conductive material may be sequentially deposited on the base substrate 110 through the first process chamber 23 and the second process chamber 24.

Each of the first process chamber 23 and the second process chamber 24 may include a sputtering unit that generates plasma for the sputtering process. The sputtering unit may be used to deposit the conductive material on the base substrate 110.

While the plasma is being generated, the inside of the first process chamber 23 and the second process chamber 24 may be heated at a relatively high temperature. Thus, the base substrate 110 may have a temperature of about 250° C. to about 350° C. after the conductive material is deposited on the base substrate 110.

The transfer chamber 30 may return the base substrate 110 provided from the process chamber back to the process chamber so that the process chamber may further perform an additional process (e.g., an additional deposition process) on the base substrate 110. Alternatively, the base substrate 110 may be returned from the transfer chamber 30 to the loading chamber 10 through the process chamber, the buffer chamber 22 and the loadlock chamber 21 without an additional process being performed, and then the base substrate 110 may be may released from the apparatus by the loading chamber 10.

The transfer chamber 30 may cool the base substrate 110 on which the conductive material is deposited. For example, the base substrate 110 may be cooled in the vacuum by the transfer chamber 30.

As illustrated in FIG. 6A, the transfer chamber 30 may include a first cooling plate 31 and a second cooling plate 32 positioned opposite to the first cooling plate 31. Before the base substrate 110 on which the conductive material is deposited is returned to the process chamber, the first and second surfaces of the base substrate 110 may be contacted with the first and second cooling plates 31 and 32 in the transfer chamber 30, respectively, and thus the base substrate 110 may be cooled.

For example, as illustrated in FIG. 6B, a first cooling plate 31 may be applied or pressed against a first surface of the base substrate 110, and a second cooling plate 32 may be applied or pressed against a second surface of the base substrate 110. The cooling plates 31 and 32 may or may not be in direct contact with the base substrate 110 (e.g., a metal layer may be disposed between the first surface of the base substrate and the cooling plate 31) when being applied or pressed against the base substrate 110. The first and second surfaces of the base substrate 110 may face opposite directions.

In some example embodiments, a chiller may be connected to a surface of each of the first and second cooling plates 31 and 32 so that the first and second cooling plates 31 and 32 may be cooled by the chiller. For example, liquid nitrogen may be injected into the chiller. Thus, the first and second cooling plates 31 and 32 may be cooled by liquid nitrogen. Accordingly, the base substrate 110 on which the conductive material is formed may be cooled by contacting the first and second cooling plates 31 and 32, and may be cooled to a temperature of about −60° C. to about 0° C.

The above-described embodiments may be used in a display apparatus including a thin film transistor and/or a system including the display apparatus, such as an LCD apparatus, an OLED apparatus, etc.

The foregoing is illustrative of example embodiments and is not limiting of the present system and method. Those of ordinary skill in the art would readily appreciate that many modifications are possible in the example embodiments without materially departing from the scope and spirit of the present system and method.

What is claimed is:

1. A method of manufacturing a thin film transistor substrate, the method comprising:
   forming a first metal layer on a first surface of a base substrate;
   cooling the base substrate by directly contacting the first metal layer with at least the central portion of a first cooling plate and by directly contacting a second surface of the base substrate with at least the central portion of a second cooling plate, the first and second surfaces of the base substrate facing opposite directions;
   forming a gate electrode by patterning the first metal layer;
   forming a source electrode and a drain electrode, the source electrode being spaced apart from the drain electrode, the source and drain electrodes partially overlapping the gate electrode; and
   forming a pixel electrode electrically connected to the drain electrode.

2. The method of claim 1, wherein the first metal layer includes at least one conductive material selected from the group consisting of aurum (Au), copper (Cu), nickel (Ni), aluminum (Al), molybdenum (Mo), chrome (Cr), tantalum (Ta), titanium (Ti) and an alloy thereof.

3. The method of claim 1, wherein the first metal layer has a thickness of about 1 µm to about 3 µm.

4. The method of claim 1, wherein the base substrate is cooled to a temperature of about −60° C. to about 0° C.

5. The method of claim 1, wherein forming the gate electrode includes preheating the cooled base substrate before patterning the first metal layer.

6. The method of claim 5, wherein the base substrate is preheated to the ambient temperature.

7. The method of claim 1, wherein forming the source electrode and the drain electrode includes:
   forming a second metal layer on the base substrate on which the gate electrode is formed;
   cooling the base substrate by contacting the second metal layer with the first cooling plate and by contacting the second surface of the base substrate with the second cooling plate; and
   patterning the second metal layer.

8. The method of claim 7, wherein the second metal layer includes at least one conductive material selected from the group consisting of aurum (Au), copper (Cu), nickel (Ni), aluminum (Al), molybdenum (Mo), chrome (Cr), tantalum (Ta), titanium (Ti) and an alloy thereof.

9. The method of claim 1, wherein forming the pixel electrode includes:
   forming a third metal layer on the base substrate on which the source and drain electrodes are formed;
   cooling the base substrate by contacting the third metal layer with the first cooling plate and by contacting the second surface of the base substrate with the second cooling plate; and
   patterning the third metal layer.

10. The method of claim 9, wherein the third metal layer includes at least one conductive material selected from the group consisting of indium tin oxide (ITO), indium zinc oxide (IZO) and aluminum zinc oxide (AZO).

* * * * *